(12) United States Patent
Tsai et al.

(10) Patent No.: US 7,953,201 B2
(45) Date of Patent: May 31, 2011

(54) SHIFT REGISTER WITH PRE-PULL-DOWN MODULE TO SUPPRESS A SPIKE

(75) Inventors: Tsung-ting Tsai, Hsin-Chu (TW);
Ming-sheng Lai, Hsin-Chu (TW);
Min-feng Chiang, Hsin-Chu (TW);
Po-yuan Liu, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 6 days.

(21) Appl. No.: 12/502,696

(22) Filed: Jul. 14, 2009

(65) Prior Publication Data

US 2010/0150303 A1    Jun. 17, 2010

(30) Foreign Application Priority Data

Dec. 12, 2008 (TW) ................................ 97148352 A

(51) Int. Cl.
*G11C 19/00* (2006.01)
(52) U.S. Cl. ................................ 377/64; 377/69; 377/79
(58) Field of Classification Search .................... None
See application file for complete search history.

(56) References Cited

U.S. PATENT DOCUMENTS

| 5,517,542 | A | * | 5/1996 | Huq | 377/78 |
| 5,859,630 | A | * | 1/1999 | Huq | 345/100 |
| 5,949,398 | A | * | 9/1999 | Kim | 345/100 |
| 6,845,140 | B2 | | 1/2005 | Moon et al. | |
| 7,310,402 | B2 | | 12/2007 | Wei et al. | |
| 2003/0189542 | A1 | | 10/2003 | Lee et al. | |
| 2006/0017685 | A1 | | 1/2006 | Tseng et al. | |
| 2006/0146978 | A1 | * | 7/2006 | Jang | 377/64 |
| 2007/0104307 | A1 | * | 5/2007 | Kim et al. | 377/64 |
| 2007/0127620 | A1 | * | 6/2007 | Moon et al. | 377/64 |
| 2007/0195920 | A1 | * | 8/2007 | Tobita | 377/64 |

FOREIGN PATENT DOCUMENTS

| CN | 1240043 | 12/1999 |
| CN | 101303895 | 11/2008 |
| TW | I246086 | 12/2005 |

* cited by examiner

*Primary Examiner* — Tuan Lam

(57) ABSTRACT

A shift register includes a plurality of shift register stages cascade-connected with each other. Each shift register stage includes a pull up module for outputting an output pulse in response to a first clock signal, a pull-up driving module for turning on the pull up module in response to a driving pulse of a previous one stage of the shift register, a pre-pull-down module coupled to a previous two stage of the shift register and a first node for pulling down voltage level of the first node in response to a output pulse of the previous two stage of the shift register, a pull down module coupled to the first node for pulling down voltage level of the first node in response to a pulling-down triggering signal, and a pulling down driving module for providing the pulling-down triggering signal.

12 Claims, 9 Drawing Sheets

SHIFT REGISTER WITH PRE-PULL-DOWN MODULE TO SUPPRESS A SPIKE

CLAIM OF PRIORITY

This application claims priority to Taiwanese Patent Application No. 097148352 filed on Dec. 12, 2008.

BACKGROUND OF THE INVENTION

1. Field of the Invention

The present invention relates to a shift register, and more particularly, to a shift register capable of suppressing a transient spike.

2. Description of Prior Art

With a rapid development of monitor types, novel and colorful monitors with high resolution, e.g., liquid crystal displays (LCDs), are indispensable components used in various electronic products such as monitors for notebook computers, personal digital assistants (PDAs), digital cameras, and projectors. The demand for the novelty and colorful monitors has increased tremendously.

Referring to FIG. 1 showing a block diagram of a conventional LCD device 10, the LCD device 10 includes a LCD panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains 1024×768×3 pixel units 20. The gate driver 14 periodically outputs a scanning signal to turn on each transistor 22 of the pixel units 20 row by row, meanwhile, each pixel units 20 is charged to a corresponding voltage level based on a data signal from the source driver 16, to show various gray levels. After a row of pixel units is finished to be charged, the gate driver 14 stops outputting the scanning signal to this row, and then outputs the scanning signal to turn on the transistors 22 of the pixel units of the next row sequentially until all pixel units 20 of the liquid crystal panel 12 finish charging, and the gate driver 14 outputs the scanning signal to the first row again and repeats the above-mentioned mechanism.

In conventional liquid crystal displays, the gate driver 14 functions as a shift register. In other words, the gate driver 14 outputs a scanning signal to the liquid crystal panel 12 at a fixed interval. For instance, a liquid crystal panel 12 with 1024×768 pixels and its operating frequency with 60 Hz is provided, the display interval of each frame is about 16.67 ms (i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Referring to FIG. 2 illustrating accumulated transient spike via multiple stages of the shift register, each stage of the shift register which is for use in the gate driver 14 manufactured by using Low Temperature Poly-Silicon (LTPS) processes may export a transient spike 40 which is induced by a spike 40 from previous two stage. Therefore, the unwanted spike accumulates and increments stage by stage. In case of a magnitude of the accumulated spike in excess of the output pulse 42, pixel units start charging even if the output pulse 42 does not received. In this way, the pixel units to be charged upon a reception of the transient spike 40 results in an incorrect display view.

SUMMARY OF THE INVENTION

It is therefore an object of the present invention to provide a shift register capable of suppressing a transient spike fed from a previous stage, thereby effectively solving the above-mentioned problem existing in the prior art.

According to the present invention, a shift register comprises a plurality of cascade-connected stages, and each stage is used for outputting an output pulse at an output end based on a first clock signal, a second signal, and a driving signal pulse from the previous one stage. Each stage comprises a pull-up module coupled to a first node, for providing the output pulse based on the first clock signal; a pull-up driving module coupled to the first node for switching on the pull-up module in response to the driving signal pulse from the previous one stage; a pre-pull-down module comprising a first end coupled to the first node, a second end coupled to an output end of previous two stage, and a third end coupled to a supply voltage end to receive a supply voltage, the pre-pull-down circuit for adjusting a voltage level of the first node to the supply voltage in response to an output pulse from the previous two stage; a pull-down module coupled to the first node for pulling down the voltage level of the first node to the supply voltage based on a pull-down driving signal; and a pull-down driving module for providing a pull-down triggering signal.

In one aspect of the present invention, the pre-pull-down module comprises a first transistor of which a drain is coupled to the first end, a gate is coupled to the second end, and a source coupled to the third end.

In another aspect of the present invention, the pull-up module comprises a second transistor and a third transistor. The second transistor comprises a drain coupled to the first clock signal, a gate coupled to the first node, and a source coupled to a driving signal end. The third transistor comprises a drain coupled to the first clock signal, a gate coupled to the first node, and a source coupled to the output end. The pull-up driving module comprises a fourth transistor comprising a drain coupled to a driving signal end of the previous one stage, a gate coupled to the driving signal end of the previous one stage, and a source coupled to the first node. The pull-down module comprises: a fifth transistor comprising a drain coupled to the first node, a gate coupled to a second node, and a source coupled to the output end; a sixth transistor comprising a drain coupled to the output end, a gate coupled to the second node, and a source coupled to the supply voltage end; a seventh transistor comprising a drain coupled to the driving signal end, a gate coupled to the second node, and a source coupled to the supply voltage end; an eighth transistor comprising a drain coupled to the second node, a gate coupled to the driving signal end, and a source coupled to the supply voltage end; a ninth transistor comprising a drain coupled to a third node, a gate coupled to a driving signal end of the previous one stage, and a source coupled to the supply voltage end; a tenth transistor comprising a drain coupled to the third node, a gate coupled to the driving signal end, and a source coupled to the supply voltage end; an eleventh transistor comprising a drain coupled to the second clock signal, a gate coupled to the second clock signal, and a source coupled to the third node; a twelfth transistor comprising a drain coupled to the first node, a gate coupled to the third node, and a source coupled to the supply voltage end; a thirteenth transistor comprising a drain coupled to the driving signal end, a gate coupled to the third node, and a source coupled to the supply voltage end; a fourteenth transistor comprising a drain coupled to the output end, a gate coupled to the second clock signal, and a source coupled to the supply voltage end; a fifteenth transistor comprising a drain coupled to the first node, a gate coupled to an output end of the next stage, and a source coupled to the supply voltage end; a sixteenth transistor comprising a drain coupled to the output end, a gate coupled to the output end of the next stage, and a source coupled to the supply voltage end; and a nineteenth transistor comprising a drain coupled to the first node, a gate coupled to a start pulse, and a source coupled to the supply voltage end.

In still another aspect of the present invention, the pull-down module comprises: a fifth transistor comprising a drain coupled to the first node, a gate coupled to a second node, and a source coupled to the output end; a sixth transistor comprising a drain coupled to the output end, a gate coupled to the second node, and a source coupled to the supply voltage end; a seventh transistor comprising a drain coupled to the driving signal end, a gate coupled to the second node, and a source coupled to the supply voltage end; an eighth transistor comprising a drain coupled to the second node, a gate coupled to the first node, and a source coupled to the supply voltage end; a ninth transistor comprising a drain coupled to a third node, a gate coupled to the first node, and a source coupled to the supply voltage end; a tenth transistor comprising a drain coupled to the second clock signal, a gate coupled to the second clock signal, and a source coupled to the third node; an eleventh transistor comprising a drain coupled to the third node, a gate coupled to the first clock signal, and a source coupled to the supply voltage end; a twelfth transistor comprising a drain coupled to the first node, a gate coupled to the third node, and a source coupled to the driving signal end of the previous one stage; a thirteenth transistor comprising a drain coupled to the driving signal end, a gate coupled to the third node, and a source coupled to the supply voltage end; a fourteenth transistor comprising a drain coupled to the output end, a gate coupled to the third node, and a source coupled to the supply voltage end; a fifteenth transistor comprising a drain coupled to the first node, a gate coupled to an output end of the next stage, and a source coupled to the supply voltage end; and a sixteenth transistor comprising a drain coupled to the output end, a gate coupled to the output end of the next stage, and a source coupled to the supply voltage end.

In yet another aspect of the present invention, the pull-down driving module comprises: a seventeenth transistor comprising a drain coupled to the first clock signal, a gate coupled to the first clock signal, and a source coupled to the second node; and an eighteenth transistor comprising a drain coupled to the second node, a gate and a source coupled to the second clock signal.

In yet another aspect of the present invention, the pull-down module comprises: a fifth transistor comprising a drain coupled to the driving signal end of the previous one stage, a gate coupled to the second clock signal, and a source coupled to the first node; a sixth transistor comprising a drain coupled to the first node, a gate coupled to a start pulse, and a source coupled to the supply voltage end; a seventh transistor comprising a drain coupled to the first node, a gate coupled to the first clock signal, and a source coupled to the supply voltage end; an eighth transistor comprising a drain coupled to a second node, a gate coupled to the second clock signal, and a source coupled to the supply voltage end; a ninth transistor comprising a drain coupled to the first node, a gate coupled to an output end of the next stage, and a source coupled to the supply voltage end; a tenth transistor comprising a drain coupled to the output end, a gate coupled to a third node, and a source coupled to the supply voltage end; and an eleventh transistor comprising a drain coupled to the output end, a gate coupled to the output end of the next stage, and a source coupled to the supply voltage end. In addition, the pull-down driving module comprises: a thirteenth transistor comprising a drain coupled to the first clock signal, a gate coupled to the first clock signal, and a source coupled to a fourth node; a fourteenth transistor comprising a drain coupled to the fourth node, a gate coupled to the output end, and a source coupled to the supply voltage end; a fifteenth transistor comprising a drain coupled to the first clock signal, a gate coupled to the fourth node, and a source coupled to the third node; and a sixteenth transistor comprising a drain coupled to the third node, a gate coupled to the output end, and a source coupled to the supply voltage end.

These and other objects of the claimed invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1:
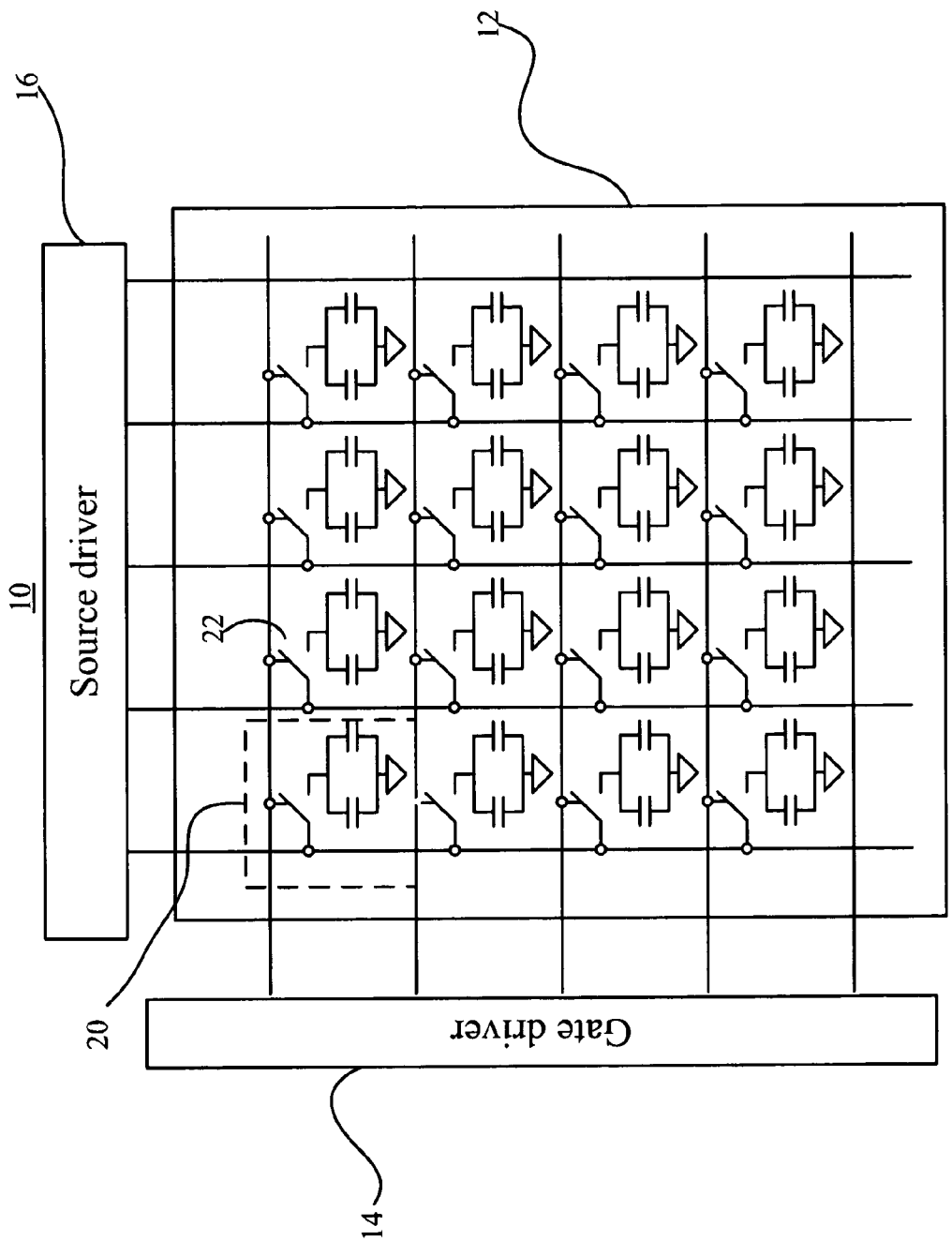
FIG. 1 shows a block diagram of shift register device according to the present invention.
Figure 2:
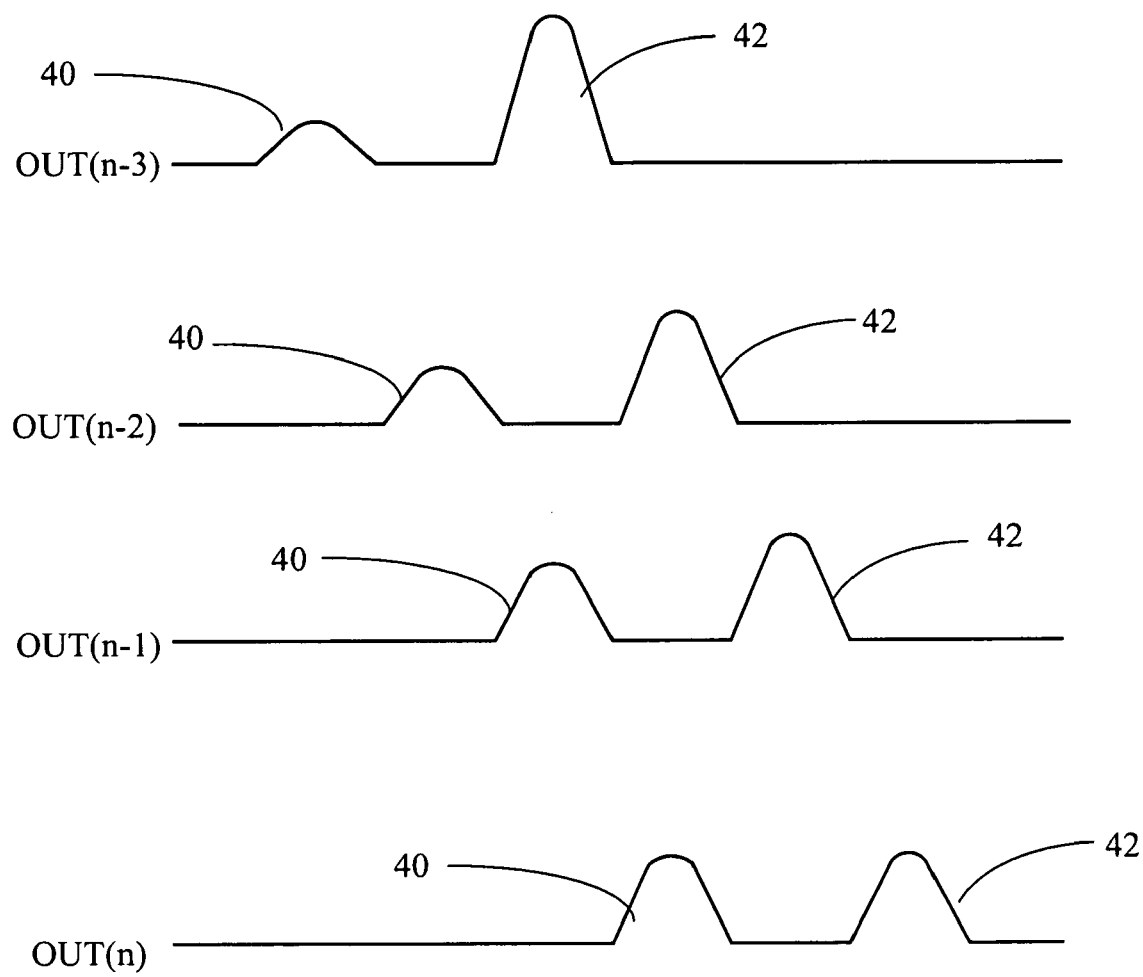
FIG. 2 illustrates accumulated transient spike via multiple stages of the shift register.
Figure 3:
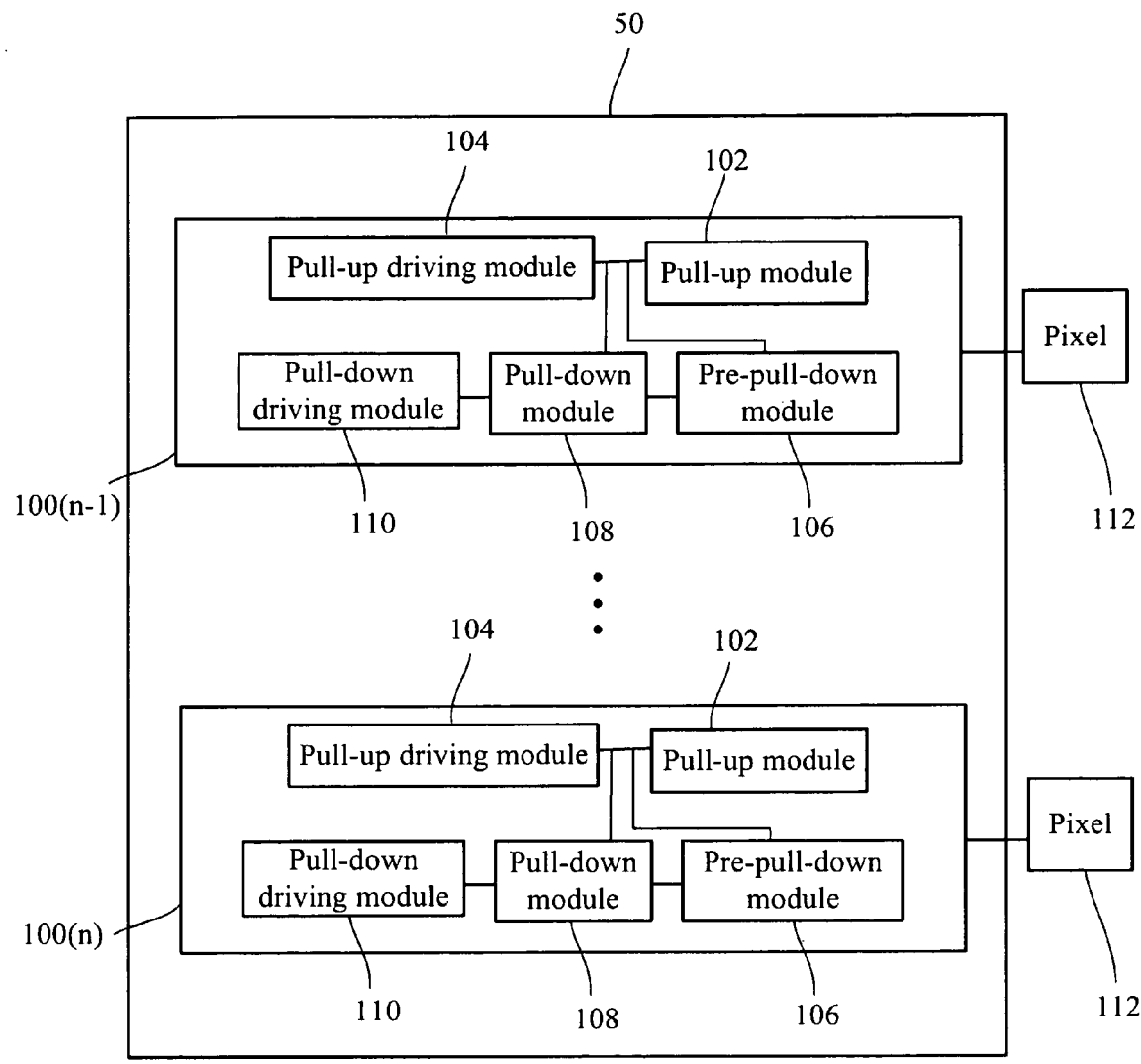
FIG. 3 shows a block diagram of a stage of the shift register according to a preferred embodiment of the present invention.

Referring to FIG. 3 showing a block diagram of a stage 100(n) of the shift register 50 according to a preferred embodiment of the present invention, the shift register 50 which may be used in a gate driver of a liquid crystal display comprises a plurality of cascade-connected stages 100(n). The stage 100(n) outputs a scan signal based on a first clock signal CK, a second clock signal XCK, and driving signal pulse from a previous one stage 100(n-1). Upon being triggered by a start pulse at input end ST(0), the first stage 100(1) delays the start pulse by a half cycle of the first clock signal CK (or the second clock signal XCK), and outputs the delayed pulse (i.e. output pulse) at an output end ST(1). Thereafter, each stage 100(n) delays an input pulse from the output end ST(n-1) of the previous stage 100(n-1) by a half cycle of the first clock signal CLK (or the second clock signal XCK), and outputs an output pulse at the output end ST(n). The output pulse is scanning signal to turn on the transistor of the pixel 112. A phase difference between the first clock signal CK and the second clock signal XCK is 180 degrees.

Each stage 100(n) comprises a pull-up module 102, a pull-up driving module 104, a pre-pull-down module 106, a pull-down module 108, and a pull-down driving module 110. The pull-up module 102 coupled to a first node Q(n) is used for providing the output pulse at the output end OUT(n) based on the first clock signal CK. The pull-up driving module 104 coupled to the first node Q(n) is used for switching on the pull-up module 102 in response to the driving signal pulse at the driving signal end ST(n−1) of the previous one stage 100(*n*−1). The pre-pull-down module 106 implemented by a first transistor T1 comprises a first end coupled to the first node Q(n), a second end coupled to an output end OUT(n−2) of the stage 100(*n*−2), and a third end coupled to a supply voltage end to receive a supply voltage $V_{SS}$. The pre-pull-down circuit 106 is used for adjusting a voltage level of the first node Q(n) to the supply voltage Vss in response to an output pulse at the output end OUT(n−2) of the previous two stage 100(*n*−2). The pull-down module 108 coupled to the first node Q(n) is used for pulling down the voltage level of the first node Q(n) to the supply voltage based on a pull-down driving signal. The pull-down driving module 110 is used for providing a pull-down triggering signal.

Figure 4A:
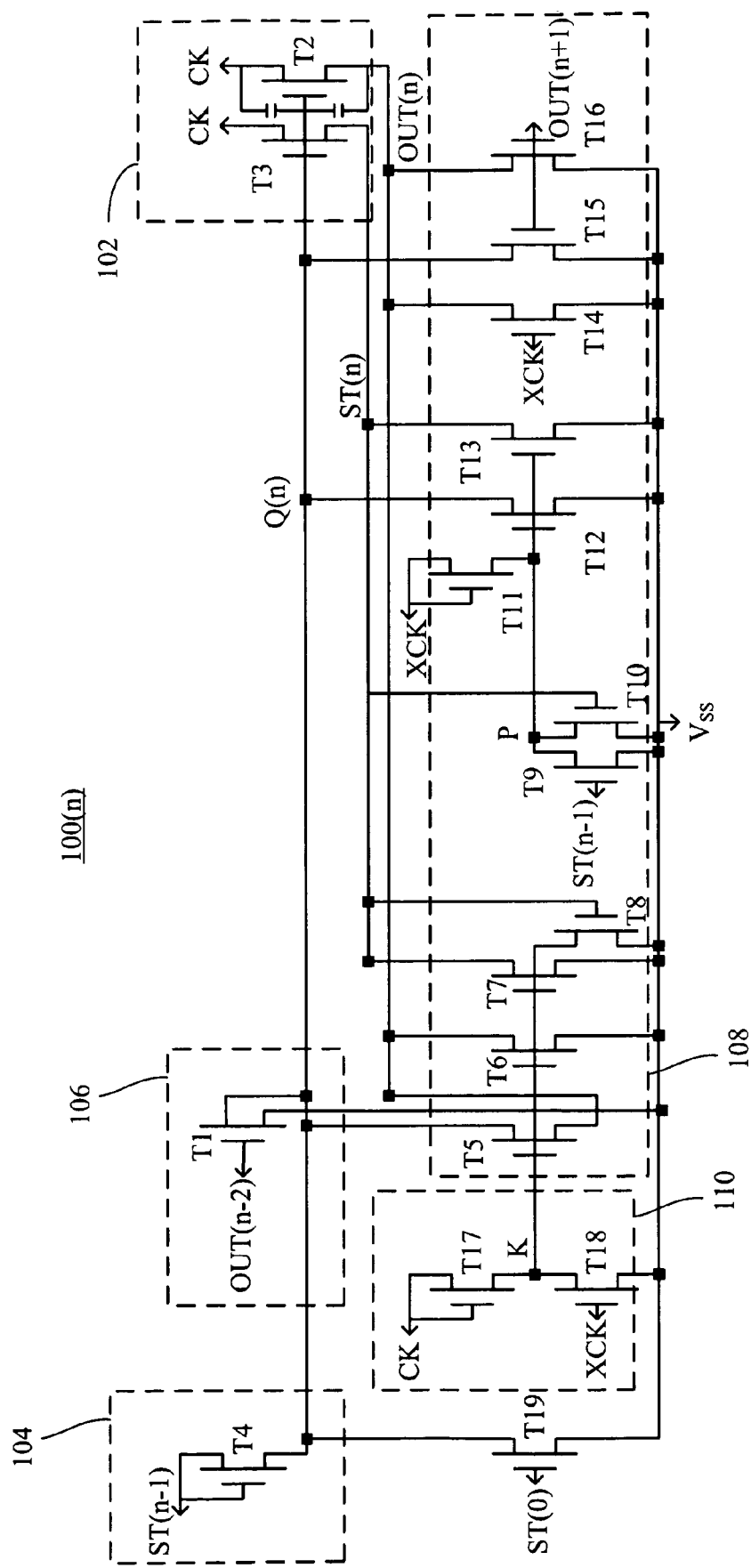
FIG. 4A shows a circuit diagram of a stage of the shift register according to a first embodiment of the present invention.

Referring to FIG. 4A showing a circuit diagram of a stage 100(*n*) of the shift register according to a first embodiment of the present invention, a pull-up module 102 comprises a second transistor T2 and a third transistor T3. The second transistor T2 comprises a drain coupled to the first clock signal CK, a gate coupled to the first node Q(n), and a source coupled to a driving signal end ST(n). The third transistor T3 comprises a drain coupled to the first clock signal CK, a gate coupled to the first node Q(n), and a source coupled to the output end OUT(n). The pull-up driving module 104, implemented by a fourth transistor T4, comprises a source coupled to the first node Q(n), a drain and a gate coupled to a driving signal end ST(n−1) of the stage 100(*n*−1). The pull-down module 108 comprises transistors T5-T16, and T19. The fifth transistor T5 comprises a drain coupled to the first node Q(n), a gate coupled to a second node K, and a source coupled to the output end OUT(n). The sixth transistor T6 comprises a drain coupled to the output end OUT(n), a gate coupled to the second node K, and a source coupled to the supply voltage end $V_{SS}$. The seventh transistor T7 comprises a drain coupled to the driving signal end ST(n), a gate coupled to the second node K, and a source coupled to the supply voltage end $V_{SS}$. The eighth transistor T8 comprises a drain coupled to the second node K, a gate coupled to the driving signal end ST(n), and a source coupled to the supply voltage end $V_{SS}$. The ninth transistor T9 comprises a drain coupled to a third node P, a gate coupled to a driving signal end ST(n−1) of the stage 100(*n*−1), and a source coupled to the supply voltage end $V_{SS}$. The tenth transistor T10 comprises a drain coupled to the third node P, a gate coupled to the driving signal end ST(n), and a source coupled to the supply voltage end $V_{SS}$. The eleventh transistor T11 comprises a drain coupled to the second clock signal XCK, a gate coupled to the second clock signal XCK, and a source coupled to the third node P. The twelfth transistor T12 comprises a drain coupled to the first node Q(n), a gate coupled to the third node P, and a source coupled to the supply voltage end $V_{SS}$. The thirteenth transistor T13 comprises a drain coupled to the driving signal end ST(n), a gate coupled to the third node P, and a source coupled to the supply voltage end $V_{SS}$. The fourteenth transistor T14 comprises a drain coupled to the output end OUT(n), a gate coupled to the second clock signal XCK, and a source coupled to the supply voltage end $V_{SS}$. The fifteenth transistor T15 comprises a drain coupled to the first node Q(n), a gate coupled to an output end OUT(n+1) of the next stage 100(*n*+1), and a source coupled to the supply voltage end $V_{SS}$. The sixteenth transistor T16 comprises a drain coupled to the output end OUT(n), a gate coupled to the output end OUT(n+1) of the next stage 100(*n*+1), and a source coupled to the supply voltage end $V_{SS}$. The nineteenth transistor T19 comprises a drain coupled to the first node Q(n), a gate coupled to an input end ST(0), and a source coupled to the supply voltage end $V_{SS}$. The pull-down driving module 110 comprises transistors T17 and T18. The seventeenth transistor T17 comprises a drain coupled to the first clock signal CK, a gate coupled to the first clock signal CK, and a source coupled to the second node K. The eighteenth sixteenth transistor T18 comprises a drain coupled to the second node K, a gate and a source coupled to the second clock signal XCK.

Figure 5:
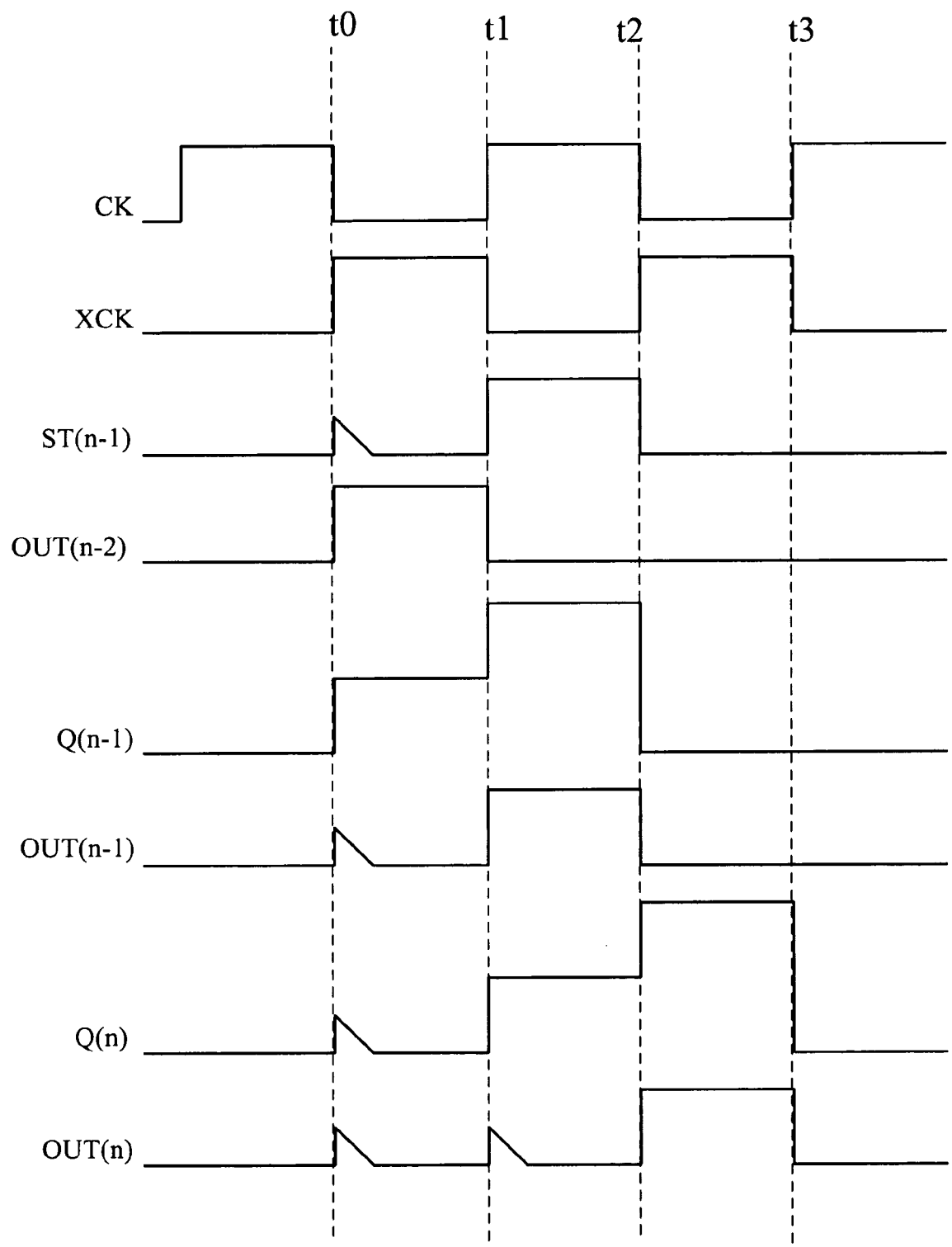
FIG. 5 illustrates a timing diagram of signals and voltage variation on relating nodes according to the present invention.

Referring to FIG. 4A and FIG. 5, FIG. 5 illustrates a timing diagram of signals and voltage variation on relating nodes according to the present invention. During a time period of t0-t1, the output pulse from the output end OUT(n−2) is at high voltage level to turn on the transistor T1 of the pre-pull-down module 106 to conduct the supply voltage $V_{SS}$, so that the voltage level of the node Q is pulled down to supply voltage Vss.

During a time period of t1-t2, the first clock signal CK is at low voltage level while the second clock signal XCK is at high voltage level. At this moment, the driving signal from the driving signal end ST(n−1) of the stage 100(*n*−1) is also at high voltage to turn on the transistor T4, so that the voltage level of the node Q(n) is pulled up. And the voltage level of node K (i.e. the pull down driving signal) is at low voltage level, the transistors T5, T6, T7 are turned off.

During a time period of t2-t3, the first clock signal CK is at high voltage level so that the voltage level on the node K becomes the high voltage level (i.e. the pull-down driving signal) to turn on the transistors T5, T6, T7. At this moment, the voltage level on the node Q(n) jumps by a level of the first clock signal CK due to capacitor coupling effect. After the voltage level of the node Q(n) jumps, the transistors T2, T3 are turned on to conduct the first clock signal CK, thereby the output end OUT(n) and the driving signal end ST(n) outputting high voltage level. For brevity, the operation of other transistors is understood by the person skilled in this art, so is omitted to describe.

It is appreciated that during the time period t0-t1, voltage level on the node Q(n) is pulled down by the pre-pull-down module 106, thereby suppressing transient spike. For each stage 100(*n*) of the shift register, since the transient spike on the node Q(n) is suppressed, an impact of the capacitor coupling effect on the transistors T2, T3 may not result in an accumulated spike at each output end.

Figure 4B:
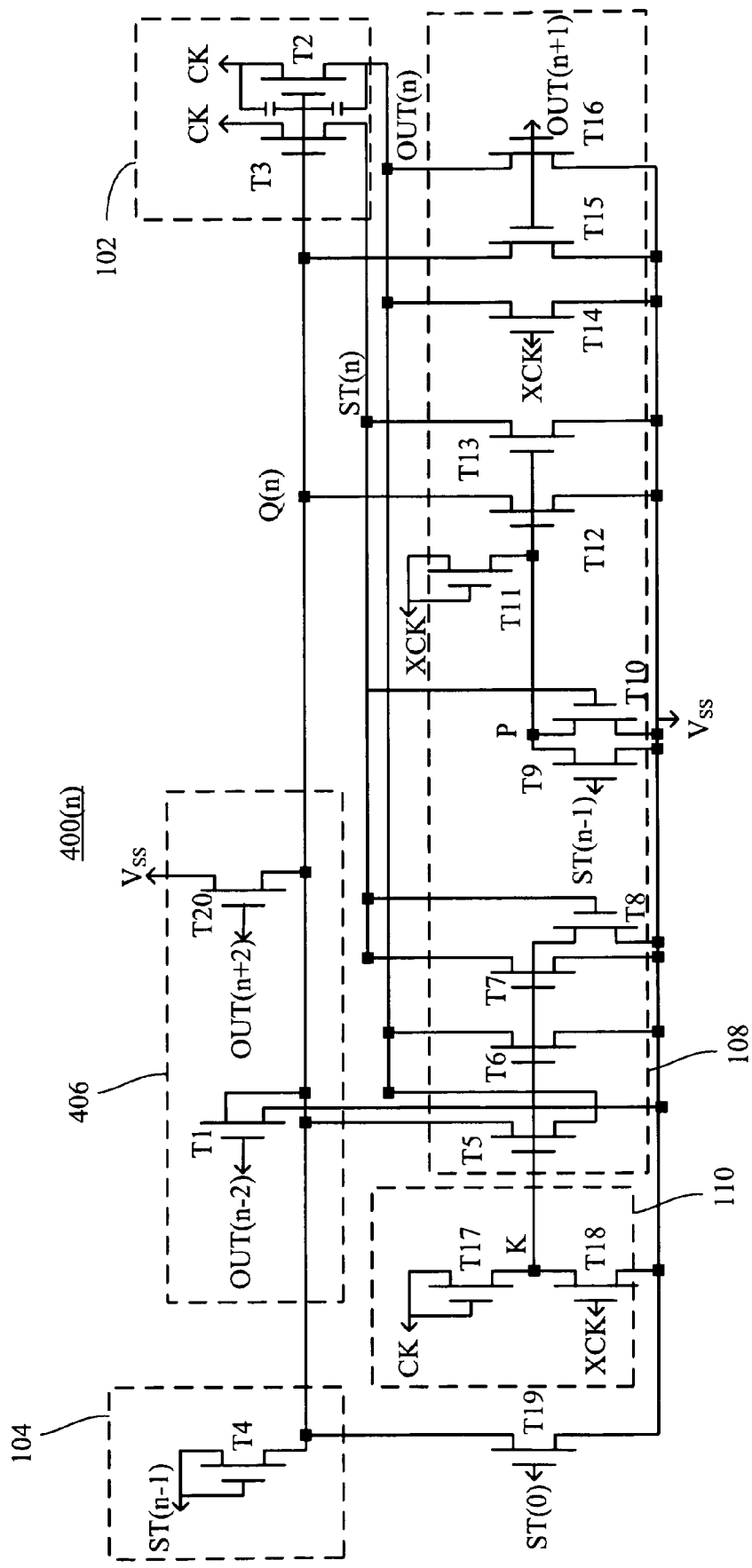
FIG. 4B shows a circuit diagram of a stage of the shift register according to a second embodiment of the present invention.

Referring to FIG. 4B, a circuit diagram of a stage 400(*n*) of a shift register according to a second embodiment of the present invention, for brevity, it is noted that elements in FIG. 4B have the same function as the ones illustrated in FIG. 4A, therefore, are provided with the same item numbers as those used in FIG. 4A. Differing from the stage 100(*n*) of the shift register in FIG. 4A, the stage 400(*n*) of the shift register in FIG. 4B is the pre-pull-down module 406 further comprises a fourth end coupled to an output end OUT(n+2) of the next two stage 400(*n*+2). The voltage level of the first node Q(n) is adjusted to supply voltage $V_{SS}$ in response to an output pulse from the stage 400(*n*+2). Preferably, the stage 400(*n*) further comprises a pull-down transistor T20. The pull-down transistor T20 comprises a drain coupled to the first node Q(n), a gate coupled to the output end OUT(n+2) of the next two stage 400(*n*+2), and a source coupled to the supply voltage end $V_{SS}$.

Figure 6A:
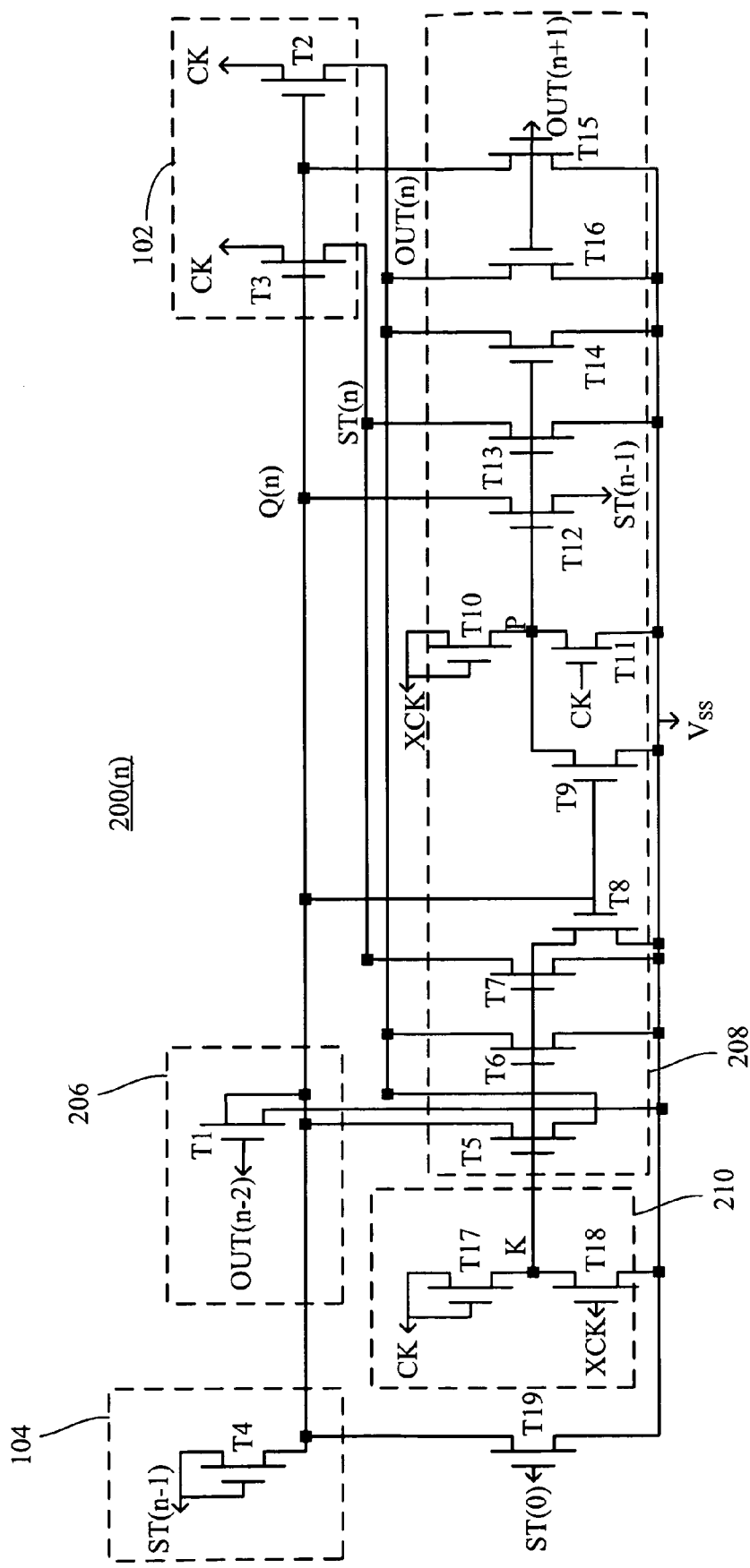
FIG. 6A shows a circuit diagram of a stage of the shift register according to a third embodiment of the present invention.

Referring to FIG. 6A, showing a circuit diagram of a stage 200(*n*) of the shift register according to a third embodiment of the present invention, a pull-up module 102 comprises a second transistor T2 and a third transistor T3. The second transistor T2 comprises a drain coupled to the first clock signal CK, a gate coupled to the first node Q(n), and a source coupled to a driving signal end ST(n). The third transistor T3 comprises a drain coupled to the first clock signal CK, a gate coupled to the first node Q(n), and a source coupled to the output end OUT(n). The pull-up driving module 104, implemented by a fourth transistor T4, comprises a source coupled to the first node Q(n), a drain and a gate coupled to a driving signal end ST(n−1) of the stage 200(*n*−1). The pre-pull-down module 206 comprises a first transistor T1. The pull-down module 208 comprises transistors T5-T16. The fifth transistor T5 comprises a drain coupled to the first node Q(n), a gate coupled to a second node K, and a source coupled to the output end OUT(n). The sixth transistor T6 comprises a drain coupled to the output end OUT(n), a gate coupled to the second node K, and a source coupled to the supply voltage end $V_{SS}$. The seventh transistor T7 comprises a drain coupled to the driving signal end ST(n), a gate coupled to the second node K, and a source coupled to the supply voltage end $V_{SS}$. The eighth transistor T8 comprises a drain coupled to the second node K, a gate coupled to the first node Q(n), and a source coupled to the supply voltage end $V_{SS}$. The ninth transistor T9 comprises a drain coupled to a third node P, a gate coupled to the first node Q(n), and a source coupled to the supply voltage end $V_{SS}$. The tenth transistor T10 comprises a drain coupled to the second clock signal XCK, a gate coupled to the second clock signal XCK, and a source coupled to the third node P. The eleventh transistor T11 comprises a drain coupled to the third node P, a gate coupled to the first clock signal CK, and a source coupled to the supply voltage end $V_{SS}$. The twelfth transistor T12 comprises a drain coupled to the first node Q(n), a gate coupled to the third node P, and a source coupled to the driving signal end ST(n−1). The thirteenth transistor T13 comprises a drain coupled to the driving signal end ST(n), a gate coupled to the third node P, and a source coupled to the supply voltage end $V_{SS}$. The fourteenth transistor T14 comprises a drain coupled to the output end OUT(n), a gate coupled to the third node P, and a source coupled to the supply voltage end $V_{SS}$. The fifteenth transistor T15 comprises a drain coupled to the first node Q(n), a gate coupled to an output end OUT(n+1) of the next stage 100(*n*+1), and a source coupled to the supply voltage end $V_{SS}$. The sixteenth transistor T16 comprises a drain coupled to the output end OUT(n), a gate coupled to the output end OUT(n+1) of the next stage 100(*n*+1), and a source coupled to the supply voltage end $V_{SS}$. The pull-down driving module 110 comprises transistors T17 and T18. The seventeenth transistor T17 comprises a drain coupled to the first clock signal CK, a gate coupled to the first clock signal CK, and a source coupled to the second node K. The eighteenth sixteenth transistor T18 comprises a drain coupled to the second node K, a gate and a source coupled to the second clock signal XCK.

It is appreciated that the stage 200(*n*) is similar to the stage 100(*n*), except the pull-down module. But both stages 200(*n*) and 100(*n*) illustrates identical signal-timing relating to the output end OUT(n), the driving signal end ST(n), and the node Q(n), as shown in FIG. 5. That is, during the time period t0-t1, voltage level on the node Q(n) is pulled down by the pre-pull-down module 206, thereby suppressing transient spike. For each stage 200(*n*) of the shift register, since the transient spike on the node Q(n) is suppressed, an impact of the capacitor coupling effect on the transistors T2, T3 may not result in an accumulated spike at each output end.

Figure 6B:
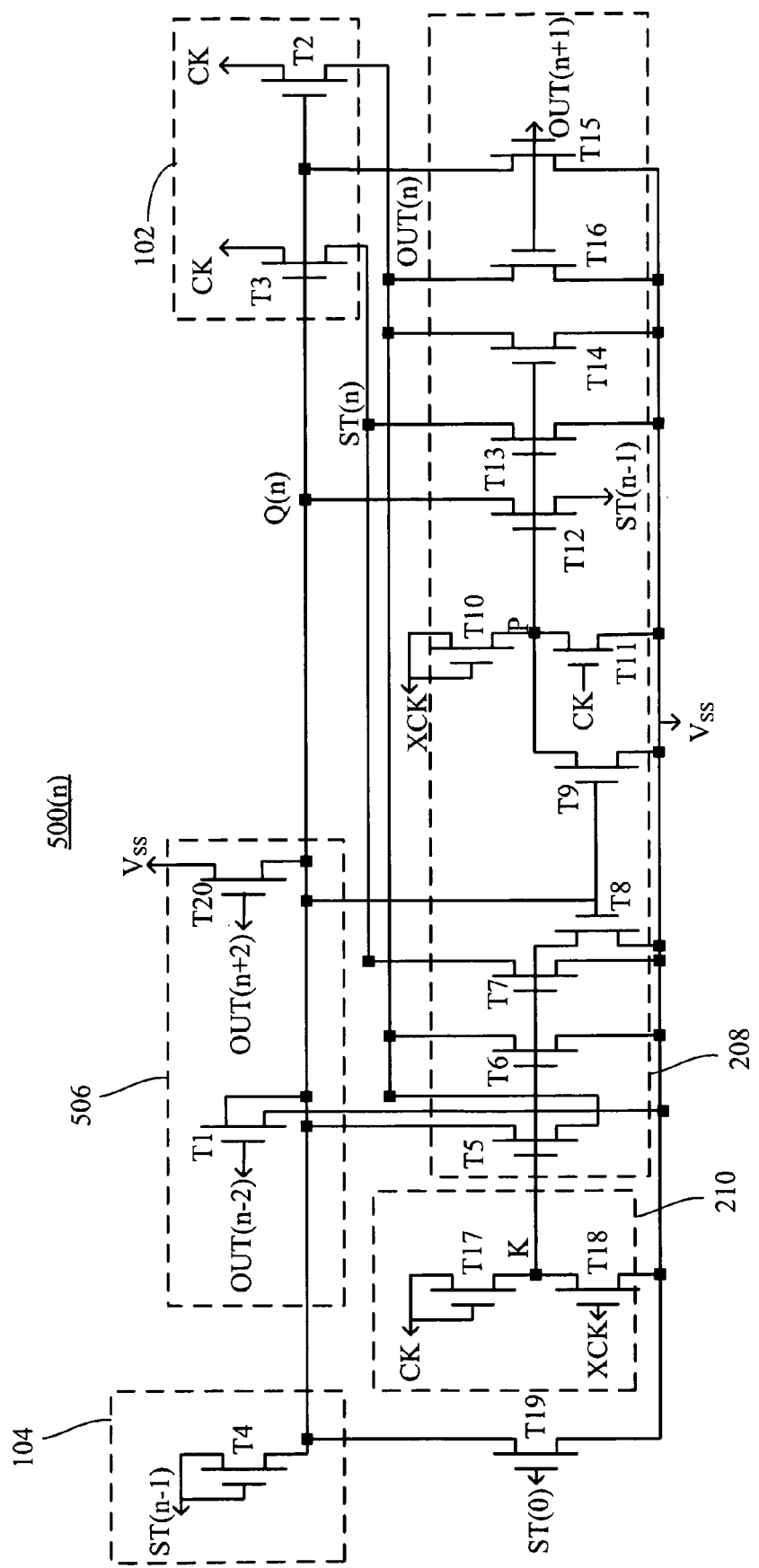
FIG. 6B shows a circuit diagram of a stage of the shift register according to a fourth embodiment of the present invention.

Referring to FIG. 6B, a circuit diagram of a stage 500(*n*) of a shift register according to a fourth embodiment of the present invention, for brevity, it is noted that elements in FIG. 6B have the same function as the ones illustrated in FIG. 6A, therefore, are provided with the same item numbers as those used in FIG. 6A. Differing from the stage 200(*n*) of the shift register in FIG. 6A, the stage 500(*n*) of the shift register in FIG. 6B is the pre-pull-down module 506 further comprises a fourth end coupled to an output end OUT(n+2) of the next two stage 500(*n*+2). The voltage level of the first node Q(n) is adjusted to supply voltage $V_{SS}$ in response to an output pulse from the stage 500(*n*+2). Preferably, the stage 500(*n*) further comprises a pull-down transistor T20. The pull-down transistor T20 comprises a drain coupled to the first node Q(n), a gate coupled to the output end OUT(n+2) of the next two stage 500(*n*+2), and a source coupled to the supply voltage end $V_{SS}$.

Figure 7:
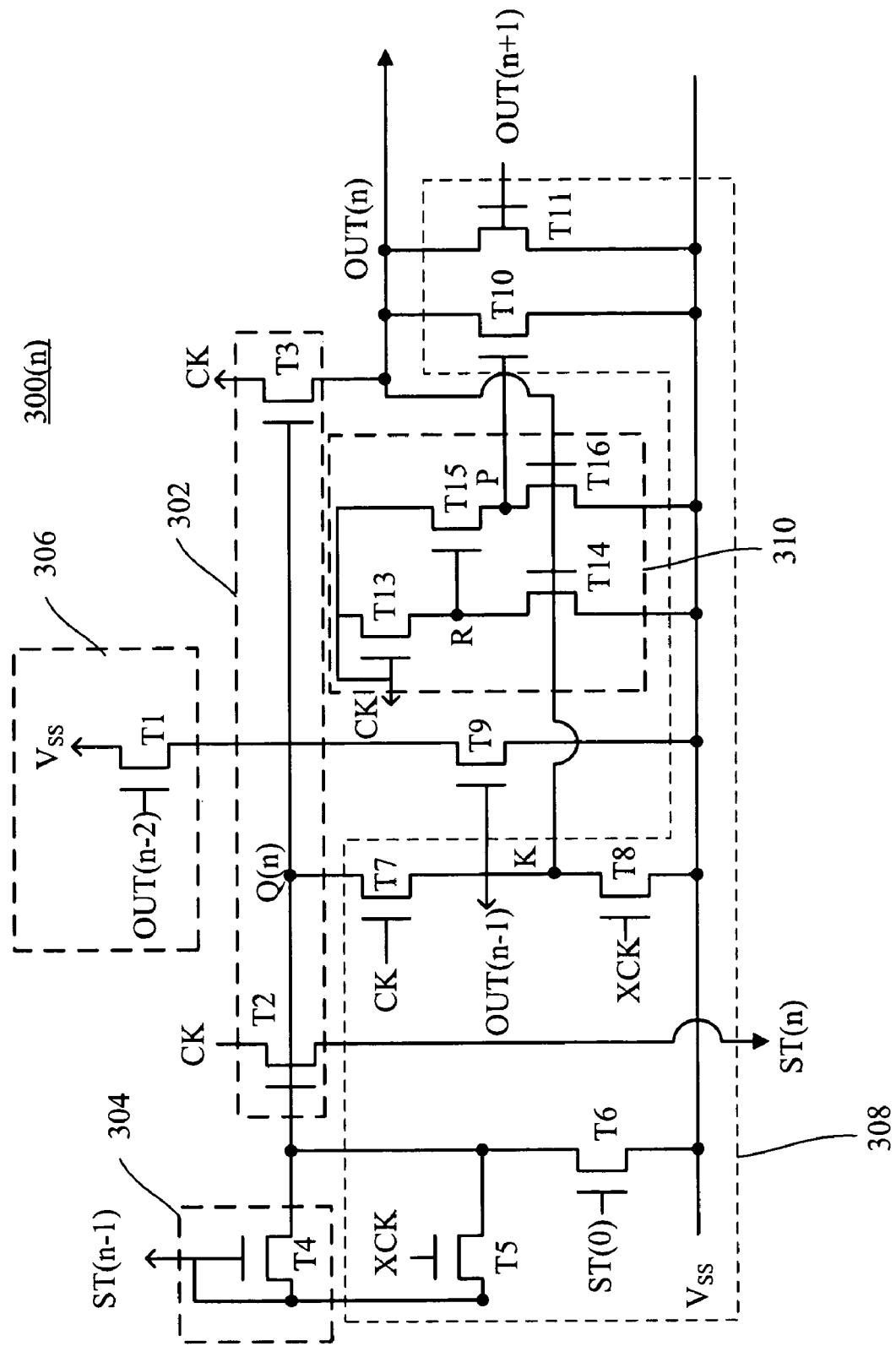
FIG. 7 shows a circuit diagram of a stage of the shift register according to a fifth embodiment of the present invention.

Referring to FIG. 7, showing a circuit diagram of a stage 300(*n*) of the shift register according to a fifth embodiment of the present invention, a pull-up module 302 comprises a second transistor T2 and a third transistor T3. The second transistor T2 comprises a drain coupled to the first clock signal CK, a gate coupled to the first node Q(n), and a source coupled to a driving signal end ST(n). The third transistor T3 comprises a drain coupled to the first clock signal CK, a gate coupled to the first node Q(n), and a source coupled to the output end OUT(n). The pull-up driving module 304, implemented by a fourth transistor T4, comprises a source coupled to the first node Q(n), a drain and a gate coupled to a driving signal end ST(n−1) of the stage 300(*n*−1). The pre-pull-down module 306 comprises a first end coupled to the first node Q(n), a second end coupled to an output end OUT(n−2) of the previous two stage 300(*n*−2), and a third end coupled to a supply voltage end $V_{SS}$. The pre-pull-down module 306 is implemented by a first transistor T1. The pull-down module 308 comprises transistors T5-T11. The fifth transistor T5 comprises a drain coupled to the driving signal end ST(n−1) of the stage 300(*n*−1), a gate coupled to the second clock signal XCK, and a source coupled to the first node Q(n). The sixth transistor T6 comprises a drain coupled to the first node Q(n), a gate coupled to the input end ST(0), and a source coupled to the supply voltage end $V_{SS}$. The seventh transistor T7 comprises a drain coupled to the first node Q(n), a gate coupled to the first clock signal CK, and a source coupled to the supply voltage end $V_{SS}$. The eighth transistor T8 comprises a drain coupled to the second node K, a gate coupled to the second clock signal XCK, and a source coupled to the supply voltage end $V_{SS}$. The ninth transistor T9 comprises a drain coupled to the first node Q(n), a gate coupled to an output end OUT(n+1) of the next stage 300(*n*+1), and a source coupled to the supply voltage end $V_{SS}$. The tenth transistor T10 comprises a drain coupled to the output end OUT(n), a gate coupled to a third node P, and a source coupled to the supply voltage end $V_{SS}$. The eleventh transistor T11 comprises a drain coupled to the output end OUT(n), a gate coupled to the output end OUT(n+1) of the next stage 300(*n*+1), and a source coupled to the supply voltage end $V_{SS}$. The pull-down driving module 310 comprises transistors T13-T16. The thirteenth transistor T13 comprises a drain coupled to the first clock signal CK, a gate coupled to the first clock signal CK, and a source coupled to a fourth node R. The fourteenth transistor T14 comprises a drain coupled to the fourth node R, a gate coupled to the output end OUT(n), and a source coupled to the supply voltage end $V_{SS}$. The fifteenth transistor T15 comprises a drain coupled to the first clock signal CK, a gate coupled to the fourth node R, and a source coupled to the third node P. The sixteenth transistor T16 comprises a drain coupled to the third node P, a gate coupled to output end OUT(n), and a source coupled to the supply voltage end $V_{SS}$.

It is appreciated that both stages 300(*n*) and 100(*n*) illustrates identical signal-timing relating to the output end OUT(n), the driving signal end ST(n), and the node Q(n), as shown in FIG. 5. That is, during the time period t0-t1, voltage level on the node Q(n) is pulled down by the pre-pull-down module 306, thereby suppressing transient spike. For each stage 300

(n) of the shift register, since the transient spike on the node Q(n) is suppressed, an impact of the capacitor coupling effect on the transistors T2, T3 may not result in an accumulated spike at each output end.

In contrast to prior art, the present invention provides a shift register having a plurality of stages, and each stage comprises a pre-pull-down module for suppressing a transient spike from previous two stages. Because the transient spike from previous two stages is suppressed and thus is not delivered to the next stage, the pixel will not charge when receiving the unexpected transient spike.

The present invention has been described with reference to certain preferred and alternative embodiments which are intended to be exemplary only and not limited to the full scope of the present invention as set forth in the appended claims.

What is claimed is:

1. A shift register comprising:
   a plurality of cascade-connected stages, each stage for outputting an output pulse at an output end based on a first clock signal, a second clock signal, and a driving signal pulse from the previous one stage, a phase difference between the first clock signal and the second clock signal being 180 degrees, each stage comprising:
   a pull-up module coupled to a first node, for providing the output pulse based on the first clock signal;
   a pull-up driving module coupled to the first node for switching on the pull-up module in response to the driving signal pulse from the previous one stage;
   a pre-pull-down module comprising a first end coupled to the first node, a second end coupled to an output end of previous two stage, and a third end coupled to a supply voltage end to receive a supply voltage, the pre-pull-down circuit for adjusting a voltage level of the first node to the supply voltage in response to an output pulse from the previous two stage;
   a pull-down module coupled to the first node for pulling down the voltage level of the first node to the supply voltage based on a pull-down driving signal; and
   a pull-down driving module for providing the pull-down driving signal.

2. The shift register of claim 1, wherein the pre-pull-down module comprises a first transistor of which a drain is coupled to the first end, a gate is coupled to the second end, and a source coupled to the third end.

3. The shift register of claim 2, wherein the pull-up module comprises:
   a second transistor comprising a drain coupled to the first clock signal, a gate coupled to the first node, and a source coupled to a driving signal end; and
   a third transistor comprising a drain coupled to the first clock signal, a gate coupled to the first node, and a source coupled to the output end.

4. The shift register of claim 3, wherein the pull-up driving module comprises a fourth transistor comprising a drain coupled to a driving signal end of the previous one stage, a gate coupled to the driving signal end of the previous one stage, and a source coupled to the first node.

5. The shift register of claim 4, wherein the pull-down module comprises:
   a fifth transistor comprising a drain coupled to the first node, a gate coupled to a second node, and a source coupled to the output end;
   a sixth transistor comprising a drain coupled to the output end, a gate coupled to the second node, and a source coupled to the supply voltage end;
   a seventh transistor comprising a drain coupled to the driving signal end, a gate coupled to the second node, and a source coupled to the supply voltage end;
   an eighth transistor comprising a drain coupled to the second node, a gate coupled to the driving signal end, and a source coupled to the supply voltage end;
   a ninth transistor comprising a drain coupled to a third node, a gate coupled to a driving signal end of the previous one stage, and a source coupled to the supply voltage end;
   a tenth transistor comprising a drain coupled to the third node, a gate coupled to the driving signal end, and a source coupled to the supply voltage end;
   an eleventh transistor comprising a drain coupled to the second clock signal, a gate coupled to the second clock signal, and a source coupled to the third node;
   a twelfth transistor comprising a drain coupled to the first node, a gate coupled to the third node, and a source coupled to the supply voltage end;
   a thirteenth transistor comprising a drain coupled to the driving signal end, a gate coupled to the third node, and a source coupled to the supply voltage end;
   a fourteenth transistor comprising a drain coupled to the output end, a gate coupled to the second clock signal, and a source coupled to the supply voltage end;
   a fifteenth transistor comprising a drain coupled to the first node, a gate coupled to an output end of the next stage, and a source coupled to the supply voltage end;
   a sixteenth transistor comprising a drain coupled to the output end, a gate coupled to the output end of the next stage, and a source coupled to the supply voltage end; and
   a nineteenth transistor comprising a drain coupled to the first node, a gate coupled to a start pulse, and a source coupled to the supply voltage end.

6. The shift register of claim 4, wherein the pull-down module comprises:
   a fifth transistor comprising a drain coupled to the first node, a gate coupled to a second node, and a source coupled to the output end;
   a sixth transistor comprising a drain coupled to the output end, a gate coupled to the second node, and a source coupled to the supply voltage end;
   a seventh transistor comprising a drain coupled to the driving signal end, a gate coupled to the second node, and a source coupled to the supply voltage end;
   an eighth transistor comprising a drain coupled to the second node, a gate coupled to the first node, and a source coupled to the supply voltage end;
   a ninth transistor comprising a drain coupled to a third node, a gate coupled to the first node, and a source coupled to the supply voltage end;
   a tenth transistor comprising a drain coupled to the second clock signal, a gate coupled to the second clock signal, and a source coupled to the third node;
   an eleventh transistor comprising a drain coupled to the third node, a gate coupled to the first clock signal, and a source coupled to the supply voltage end;
   a twelfth transistor comprising a drain coupled to the first node, a gate coupled to the third node, and a source coupled to the driving signal end of the previous one stage;
   a thirteenth transistor comprising a drain coupled to the driving signal end, a gate coupled to the third node, and a source coupled to the supply voltage end;

a fourteenth transistor comprising a drain coupled to the output end, a gate coupled to the third node, and a source coupled to the supply voltage end;

a fifteenth transistor comprising a drain coupled to the first node, a gate coupled to an output end of the next stage, and a source coupled to the supply voltage end; and a sixteenth transistor comprising a drain coupled to the output end, a gate coupled to the output end of the next stage, and a source coupled to the supply voltage end.

7. The shift register of claim 4, wherein the pull-down driving module comprises:

a seventeenth transistor comprising a drain coupled to the first clock signal, a gate coupled to the first clock signal, and a source coupled to the second node; and an eighteenth transistor comprising a drain coupled to the second node, a gate and a source coupled to the second clock signal.

8. The shift register of claim 4, wherein the pull-down module comprises:

a fifth transistor comprising a drain coupled to the driving signal end of the previous one stage, a gate coupled to the second clock signal, and a source coupled to the first node;

a sixth transistor comprising a drain coupled to the first node, a gate coupled to a start pulse, and a source coupled to the supply voltage end;

a seventh transistor comprising a drain coupled to the first node, a gate coupled to the first clock signal, and a source coupled to the supply voltage end;

an eighth transistor comprising a drain coupled to a second node, a gate coupled to the second clock signal, and a source coupled to the supply voltage end;

a ninth transistor comprising a drain coupled to the first node, a gate coupled to an output end of the next stage, and a source coupled to the supply voltage end;

a tenth transistor comprising a drain coupled to the output end, a gate coupled to a third node, and a source coupled to the supply voltage end; and an eleventh transistor comprising a drain coupled to the output end, a gate coupled to the output end of the next stage, and a source coupled to the supply voltage end.

9. The shift register of claim 8, wherein the pull-down driving module comprises:

a thirteenth transistor comprising a drain coupled to the first clock signal, a gate coupled to the first clock signal, and a source coupled to a fourth node;

a fourteenth transistor comprising a drain coupled to the fourth node, a gate coupled to the output end, and a source coupled to the supply voltage end;

a fifteenth transistor comprising a drain coupled to the first clock signal, a gate coupled to the fourth node, and a source coupled to the third node; and a sixteenth transistor comprising a drain coupled to the third node, a gate coupled to the output end, and a source coupled to the supply voltage end.

10. The shift register of claim 1 being applied in a liquid crystal display.

11. The shift register of claim 1, wherein the pre-pull-down module further comprises a fourth end coupled to an output end of a next adjacent two stage, and the pre-pull-down module is used for adjusting the voltage level of the first node in response to an output pulse from the output end of the previous two stage.

12. The shift register of claim 11, wherein the pre-pull-down module further comprising a pull-down transistor of which a gate is coupled to the first end, a gate is coupled to the fourth end, and a source is coupled to the third end.

* * * * *